(12) United States Patent
Fossum et al.

(10) Patent No.: US 8,787,072 B2
(45) Date of Patent: Jul. 22, 2014

(54) FLOATING-BODY/GATE DRAM CELL

(75) Inventors: Jerry G. Fossum, Gainesville, FL (US); Zhichao Lu, Santa Clara, CA (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 497 days.

(21) Appl. No.: 13/124,066

(22) PCT Filed: Dec. 29, 2009

(86) PCT No.: PCT/US2009/069642
§ 371 (c)(1),
(2), (4) Date: Apr. 13, 2011

(87) PCT Pub. No.: WO2010/083014
PCT Pub. Date: Jul. 22, 2010

(65) Prior Publication Data
US 2011/0222337 A1 Sep. 15, 2011

Related U.S. Application Data (63) Continuation-in-part of application No. PCT/US2008/078460, filed on Oct. 1, 2008, now Pat. No. 8,498,140.

(60) Provisional application No. 61/144,289, filed on Jan. 13, 2009, provisional application No. 60/976,691, filed on Oct. 1, 2007, provisional application No. 61/017,941, filed on Dec. 31, 2007.

(51) Int. Cl.
*G11C 11/00* (2006.01)
*G11C 11/36* (2006.01)
*H01L 27/12* (2006.01)

(52) U.S. Cl.
USPC ..... 365/154; 365/175; 257/347; 257/E27.112

(58) Field of Classification Search
USPC .................. 365/175, 165, 154; 257/296, 347, 257/E27.112
See application file for complete search history.

(56) References Cited

U.S. PATENT DOCUMENTS

| 5,784,311 | A | * | 7/1998 | Assaderaghi et al. | ........ | 365/150 |
| 6,111,778 | A | * | 8/2000 | MacDonald et al. | ......... | 365/149 |
| 6,317,349 | B1 | | 11/2001 | Wong | | |
| 6,560,142 | B1 | * | 5/2003 | Ando | ........................... | 365/177 |

(Continued)

FOREIGN PATENT DOCUMENTS

KR  10-2008-0080449 A  9/2008

OTHER PUBLICATIONS

Kim, K., et al., "DRAM technology perspective for gigabit era," *IEEE Trans. Electron Devices*, Mar. 1998, pp. 598-608, vol. 45.

(Continued)

*Primary Examiner* — Hoai V Ho
*Assistant Examiner* — Tri Hoang
(74) *Attorney, Agent, or Firm* — Saliwanchik, Lloyd & Eisenschenk, P.A.

(57) ABSTRACT

Memory cell structures and biasing schemes are provided. Certain embodiments pertain to a modified floating-body gate cell, which can provide improved retention times. In one embodiment, a gated diode is used to drive the gate of a second transistor structure of a cell. In another embodiment, a body-tied-source (BTS) field effect transistor is used to drive the gate of the second transistor structure of a cell.

4 Claims, 8 Drawing Sheets

(56) References Cited

U.S. PATENT DOCUMENTS

| | | | |
|---|---|---|---|
| 6,573,549 | B1 * | 6/2003 | Deng et al. ............... 257/296 |
| 7,085,153 | B2 | 8/2006 | Ferrant et al. |
| 7,184,298 | B2 | 2/2007 | Fazan et al. |
| 7,230,846 | B2 | 6/2007 | Keshavarzi et al. |
| 8,498,140 | B2 * | 7/2013 | Fossum et al. ............... 365/72 |
| 2005/0013163 | A1 | 1/2005 | Ferrant et al. |
| 2006/0187706 | A1 | 8/2006 | Tang et al. |

OTHER PUBLICATIONS

Okhonin, S., et al., "A capacitor-less IT-DRAM cell," *IEEE Electron Device Lett.*, Feb. 2002, pp. 85-87, vol. 23.

Ranica, R., et al., "A capacitor-less DRAM cell on 75 nm gate length, 16 nm thin fully depleted SOI device for high density embedded memories," *IEDM Tech. Dig.*, Dec. 2004, pp. 277-280.

Yoshida, E., et al., "A study of highly scalable DG-FinDRAM," *IEEE Electron Device Lett.*, Sep. 2005, pp. 655-657, vol. 26.

Nagoga, M., et al., "Retention characteristics of zero-capacitor RAM (Z-RAM) cell based on FinFET and tri-gate devices," *Proc. IEEE Internat. SOI Conf.*, Oct. 2005, pp. 203-204.

Yoshida, E., et al., "A capacitorless IT-DRAM technology using gate-induced drain-leakage (GIDL) current for low-power and high-embedded memory," *IEEE Trans. Electron Devices*, Apr. 2006, pp. 692-697, vol. 53.

Hamamoto, T., et al., "A floating-body cell fully compatible with 90-nm CMOS technology node for a 128-nm DRAM and its scalability," *IEEE Trans. Electron Devices*, Mar. 2007, pp. 563-571, vol. 54.

Moore, S. K., "Masters of memory," *IEEE Spectrum*, Jan. 2007, pp. 45-49.

Fossum, J. G. et al., "New insights on 'capacitorless' floating-body DRAM cells," *IEEE Electron Device Lett.*, Jun. 2007, pp. 513-516, vol. 28.

Fossum, J. G., et al., "Pragmatic Design of Nanoscale Multi-Gate CMOS," *Tech. Digest 2004 Internat. Electron Devices Meeting*, Dec. 2004, pp. 613-616.

Mathew, L., et al., "Inverted-T Channel FET (ITFET)—A Novel Technology for 45 nm-and-Beyond CMOS," *IEDM Tech. Dig.*, Dec. 2005, pp. 731-734.

Trivedi, V.,et al., "Nanoscale FinFETs with gate-source/drain underlap," *IEEE Trans. Electron Devices*, Jan. 2005, pp. 56-62, vol. 52.

Kim, S.H., et al., "Modeling and significance of fringe capacitance in nonclassical CMOS devices with gate-source/drain underlap," *IEEE Trans. Electron Devices*, Sep. 2006, pp. 2143-2150, vol. 53.

Lu, Z., et al., "A Novel Two-Transistor Floating-Body/Gate Cell for Low-Power Nanoscale Embedded DRAM," *IEEE Trans. Electron Devices*, Jun. 2008, p. 1511, vol. 55.

Trivedi, V. P., et al., "Threshold voltage and bulk inversion effects in nonclassical CMOS devices with undoped ultra-thin bodies," *Solid-State Electron.*, Jan. 2007, p. 170, vol. 51.

Rodriguez, N., et al., "A-RAM: Novel Capacitor-Less DRAM Memory," *2009 IEEE International SOI Conference*, Oct. 2009, pp. 1-2.

* cited by examiner

FLOATING-BODY/GATE DRAM CELL

CROSS-REFERENCE TO RELATED APPLICATIONS

This application is the U.S. national stage application of International Application Serial No. PCT/US2009/069642, filed Dec. 29, 2009, which claims the benefit of U.S. Provisional Application Ser. No. 61/144,289, filed Jan. 13, 2009, and which is a continuation-in-part of International Application Serial No. PCT/US2008/078460, filed Oct. 1, 2008, now U.S. Pat. No. 8,498,140, which claims the benefit of U.S. Provisional Application Ser. No. 60/976,691, filed Oct. 1, 2007, and U.S. Provisional Application Ser. No. 61/017,941, filed Dec. 31, 2007, which are hereby incorporated by reference in their entirety, including any figures, tables, or drawings.

BACKGROUND OF THE INVENTION

A conventional dynamic random access memory (DRAM) cell uses a stack capacitor or a deep-trench capacitor for storage, which is leading to prohibitive processing complexity as the memory technology is scaled. Accordingly, study and development of "capacitorless" one-transistor (1T) DRAM cells that utilize the floating body of a silicon-on-insulator (SOI) metal oxide semiconductor field effect transistor (MOSFET) as the storage element have intensified, mainly for complementary metal oxide semiconductor (CMOS) embedded-memory applications. In such 1T floating-body cells (FBCs), charging and discharging the MOSFET body define the memory states, and the stored data are sensed via a difference, or signal margin, in the channel current ($\Delta I_{DS}$) corresponding to the threshold-voltage variation ($\Delta V_t$) that results from the body charging/discharging, i.e., from the varying body-source junction voltage ($V_{BS}$). The widespread FBC studies, which began with partially depleted (PD) SOI MOSFETs, have recently focused on fully depleted (FD) devices, including planar FD/SOI MOSFETs and FD double-gate (DG) FinFETs to avoid body-doping issues and to render the FBC more scalable with the CMOS. The FD devices require a substrate, or back-gate bias to create an accumulation layer that emulates the PD body, and enables effective charge storage and data sensing.

While FinFET CMOS technology could enable scaling of the 1T FBC to gate lengths ($L_g$) less than 10 nm, there are other issues that tend to inhibit mainstream adaptation of the 1T FBC utilizing FinFET technology. In particular, the 1T FBC utilizing FinFET technology relies on current sensing of the stored data, which can be less desirable than conventional voltage sensing because of more sophisticated sense amplifiers and added power consumption. The 1T FBC utilizing FinFET technology requires the noted bias-induced accumulation, which can complicate the cell/chip design, undermine reliability, and sacrifice layout area. In addition, because the attainable $\Delta V_t$ is fundamentally limited, several paralleled fins are needed to increase the device effective width and current to get acceptable $\Delta I_{DS}$, thus severely undermining the memory density actually achievable. For example, in the paper "Retention characteristics of zero-capacitor RAM (Z-RAM) cell based on FinFET and tri-gate devices," by Nagoda et al., with the SOI substrate biased at −30 V to get the needed accumulation, 10 fins yielded a current margin of less that 10 μA from an $L_g$=100 nm composite n-channel double gate (DG) FinFET.

Thus, there exists a need in the art for a scalable memory.

BRIEF SUMMARY

Embodiments of the present invention relate to memory devices. In accordance with an embodiment, a memory cell structure and biasing scheme is provided.

A memory cell structure is provided that can include a simplified two-transistor memory cell structure where the body of the first transistor is connected to the gate of the second transistor. In a specific embodiment, the first transistor is simplified as a p+-intrinsic-n+ (PIN) gated diode for ease of connection of the body of the first transistor to the gate of the second transistor, which can be a metal oxide semiconductor field effect transistor (MOSFET). In a specific embodiment, the gate of the 'first transistor' can be fabricated to include an overlap between the gate and the 'source' of the 'first transistor' (P-region of the PIN gated diode). In a further embodiment, the gate of the 'first transistor' can be fabricated to include an underlap between the gate and the 'drain' of the 'first transistor' (N-region of the PIN gated diode).

In accordance with embodiments of the present invention, a biasing scheme is provided that induces a channel between the 'source' and 'drain' of the 'first transistor.' Here, retention time of the memory cell can be resolved by effectively connecting the N-region of the gated diode to the P-region of the gated diode in order to create an interface for tunneling and charging.

According to a variety of implementations, a word line can be used to control the inversion of the channel region of the 'first transistor.'

In one embodiment, a biasing scheme is provided for the subject memory cell where a word line is connected to the gate of the 'first transistor,' a first bit line is connected to the 'drain' of the 'first transistor' (N-region of the PIN gated diode), a second bit line is connected to the drain of the second transistor, and a ground line is connected to the source of the second transistor. The first bit line can be used for writing to the memory cell, and the second bit line can be used for reading from the memory cell. According to an embodiment, a positive bias can be applied through the first bit line to charge the floating body of the 'first transistor' that is tied to the gate of the second transistor. In addition, a positive bias can be applied through the word line and a negative bias can be applied through the first bit line to discharge the floating body of the 'first transistor' that is tied to the gate of the second transistor. The read operation can be performed through the second bit line by raising the voltage of the floating body of the 'first transistor' that is tied to the gate of the second transistor without adversely disturbing the memory state of the cell.

In another embodiment, a biasing scheme is provided for the subject memory cell where a word line is connected to the gate of the 'first transistor,' a bit line is connected to the 'drain' of the 'first transistor' (N-region of the PIN gated diode) and the drain of the second transistor, and a ground line is connected to the source of the second transistor. The bit line can be used for writing to and reading from the memory cell. According to an embodiment, a positive bias can be applied through the bit line to charge the floating body of the 'first transistor' that is tied to the gate of the second transistor. In addition, a positive bias can be applied through the word line and a negative bias can be applied through the bit line to discharge the floating body of the 'first transistor' that is tied to the gate of the second transistor. The read operation can be performed by raising the voltage of the floating body of the 'first transistor' that is tied to the gate of the second transistor without adversely disturbing the memory state of the cell.

According to yet another embodiment, a memory cell structure is provided that includes a two-transistor memory cell structure where the body and the source of the first transistor are tied together and connected to the gate of the second transistor. According to one such embodiment, the first transistor having its body tied to its source charges is able to charge and discharge the gate of the second transistor for write '1' and write '0', via channel current.

BRIEF DESCRIPTION OF THE DRAWINGS

FIGS. 3A and 3B show band diagrams.

FIGS. 8A and 8B shows a representation of a memory cell with two bit lines according to an embodiment of the circuit of FIG. 7.

DETAILED DISCLOSURE

Embodiments of the present invention relate to memory devices. In accordance with an embodiment, a memory cell structure and biasing scheme is provided.

Embodiments of the subject technology provide a modified two-transistor floating-body cell for DRAM applications. Embodiments of the present invention can be applicable to any SOI (silicon-on-insulator) technology. In addition, certain embodiments of the present invention are applicable to bulk silicon technology. The two transistors of the modified two-transistor floating-body cell can be fabricated via planar processing, or via 3-D integration with one transistor "stacked" on top of the other. Although preferred embodiments of the present invention utilize n-type transistor structures (such as nFinFET), embodiments of the present invention can also utilize p-type transistor structures but may require a larger cell area.

Figure 1:
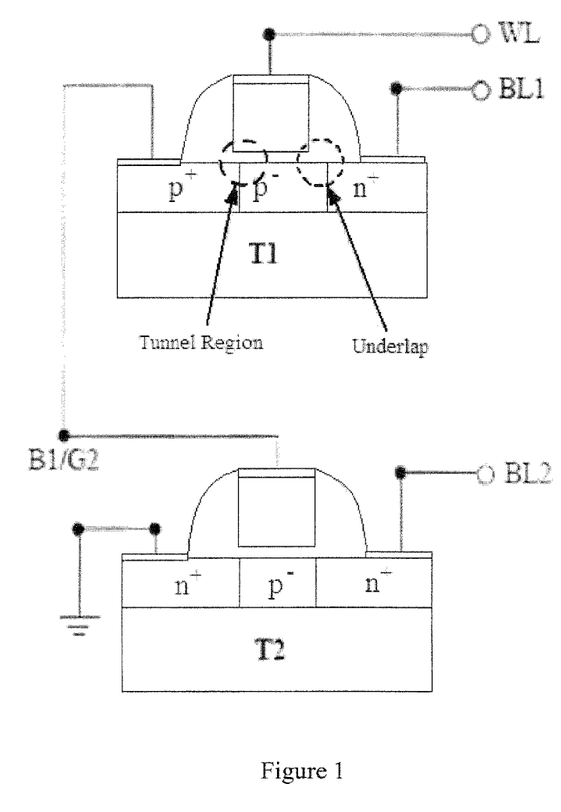
FIG. 1 shows a representation of a memory cell with two bit lines according to an embodiment of the present invention.

FIG. 1 shows a schematic representation of an embodiment of a memory cell structure. Referring to FIG. 1, a modified floating-body/gate cell (FBGC) is shown that can be fabricated on SOI for a DRAM array with two bit lines. Here, the first 'transistor' T1 is provided as a gated diode, where the transistor source is made the same conductive type as the body of T1 (e.g., p-type for an n-channel transistor structure). Thus, the 'source' of T1 can be connected to the gate of the second transistor T2. A distinguishing feature of this simplified cell is the p+ region of T1. In accordance with implementations of the present invention, T1 can be a p+-intrinsic-n+ (PIN) gated diode, where the intrinsic portion can be a region that is not intentionally doped. For example, the intrinsic portion can, in practice, be a p− region. The p+ "source" enables an easy, direct connection of the T1 body to the gate of the T2 MOSFET as indicated in FIG. 1.

For the configuration shown in FIG. 1, a word line WL can be applied to the gate of T1, a first bit line BL can be applied to the 'drain' of T1, a second bit line can be applied to the drain of T2, and the source of T2 can be tied to ground.

According to an embodiment of the present invention, T1 can be designed with underlap at its 'drain' and overlap at its 'source.' Advantageously, alignment of the gate is not as restrictive compared to the alignment required for a conventional transistor structure. In certain embodiments, the offset created by the underlap at the 'drain' and overlap at the 'source' can provide improved performance of the cell.

A biasing scheme and memory cell operation will now be described with reference to FIGS. 1 and 2A. According to an embodiment, by inverting the channel of T1 and applying a positive bias at the drain of T1 through BL1, the tunneling current between the inversion layer and the "p+ source" can be utilized to charge the B1/G2 node. That is, an n+ channel can be induced between the n+ region at the 'drain' and the p+ region at the 'source' by application of a positive bias through the word line WL. The induced inversion of the channel of T1 can effectively connect the n+ region to the p+ region, thereby creating an interface for tunneling and charging. That interface provides a location for tunneling current to charge the B1/G2 node.

To discharge B1/G2, a forward-biased body (B1/G2)-to-BL1 PN junction is realized by applying a positive bias to the gate of T1 through WL and a negative bias to BL1. A read operation can be performed by raising the B1/G2 voltage without disturbing the memory state and sensing the current, or voltage, of T2.

Figure 2A:
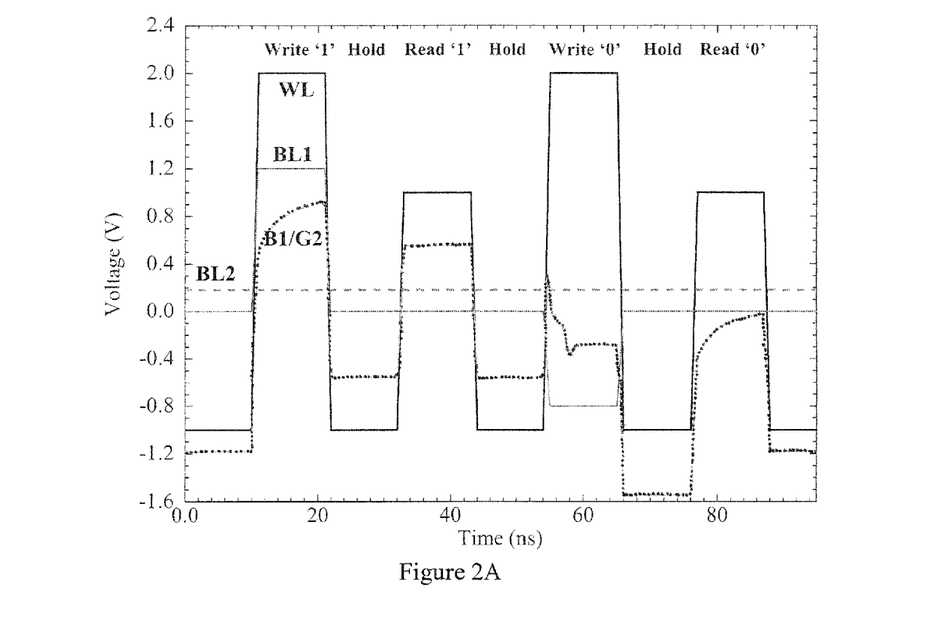
FIGS. 2A and 2B show plots of a transient sequential memory operation of a memory cell of the embodiment shown in FIG. 1, predicted by a 2-D mixed-mode numerical simulation using SenTaurus using parameters of an FD/SOI-based structure with Lg=28 nm, tox=2 nm, tSi=14 nm, tbox=50 nm, gate-source overlap=5 nm, gate-drain underlap=30 nm, undoped thin bodies, and midgap work function (TiN) gates.
Figure 2B:
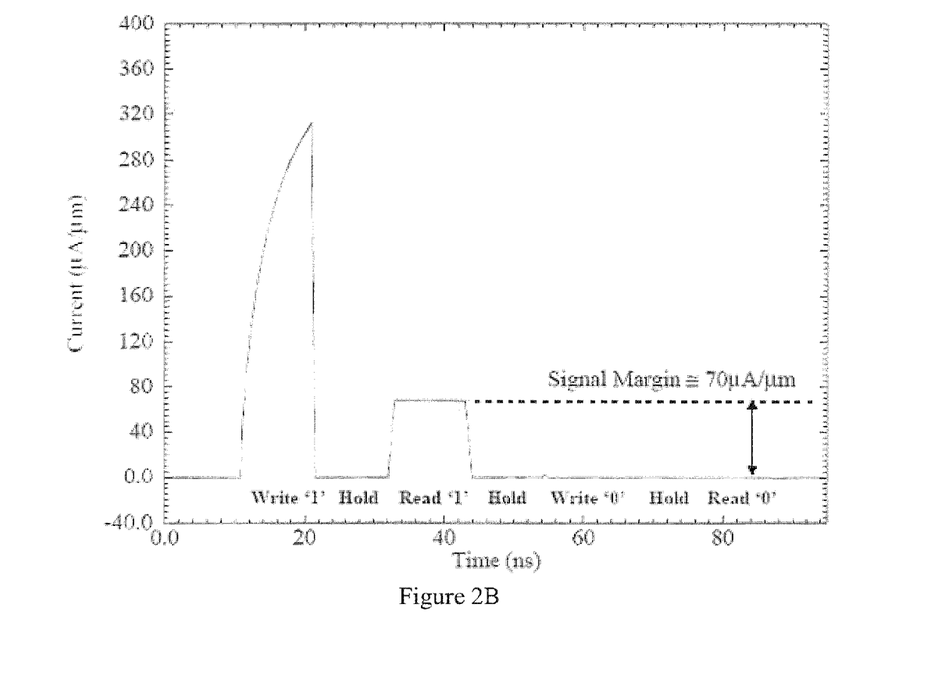

As shown in FIGS. 2A and 2B, a predicted operation sequence illustrates the effects of the described biasing scheme. In the plots, a constant voltage of 0.2V is applied to the second bit line BL2 to sense the current difference between a '1' state and a '0' state. Referring to FIG. 2B, it can seen that the signal margin between the '1' state and the '0' state is about 70 μA/μm.

Figure 3A:
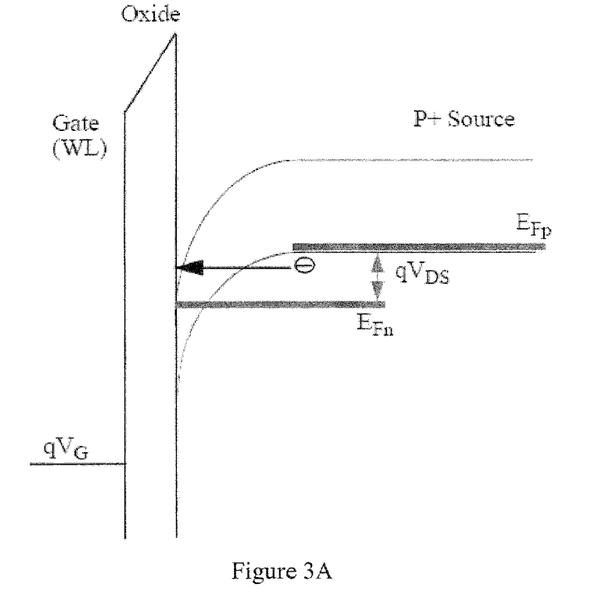
FIG. 3A is a band diagram of a charging operation in accordance with an embodiment of the present invention.
Figure 3B:
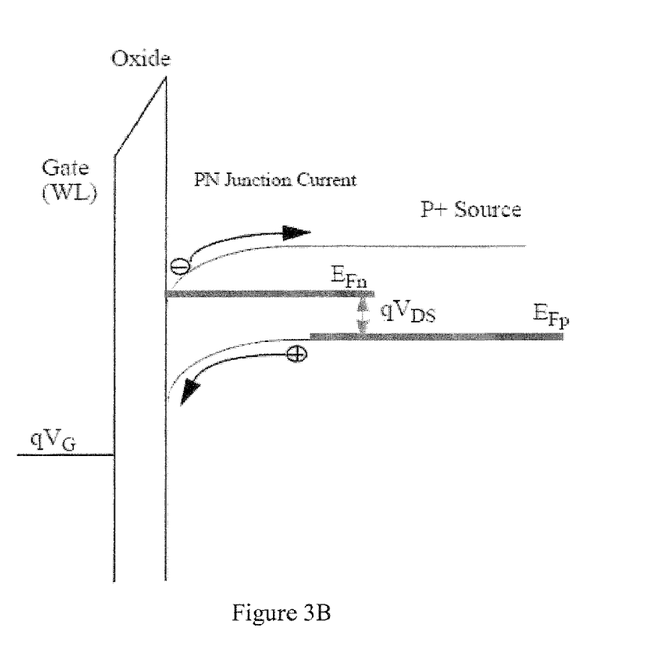
FIG. 3B is a band diagram of a discharging operation in accordance with an embodiment of the present invention.

To better understand embodiments of the subject biasing scheme, the band diagram for charging is shown in FIG. 3A and the band diagram for discharging is shown in FIG. 3B. Referring to FIG. 3A, electrons can tunnel from the valence band of "p+ source" region to the conduction band of the n+ channel/drain region. The application of particular WL and BL1 voltages can modulate the tunnel width and the available density of states. Due to the very small storage capacitance with the modified FBGC, the sub-1 ns write '1' time might be reached by carefully tuning the drain (using BL1) and gate (using WL) biases. Referring to FIG. 3B, the discharging current is the forward-biased PN junction current.

Referring back to FIG. 2A, it can be seen that the same WL voltage can be used for both write '1' and write '0' as is done in the conventional 1T/1C DRAM.

Figure 4:
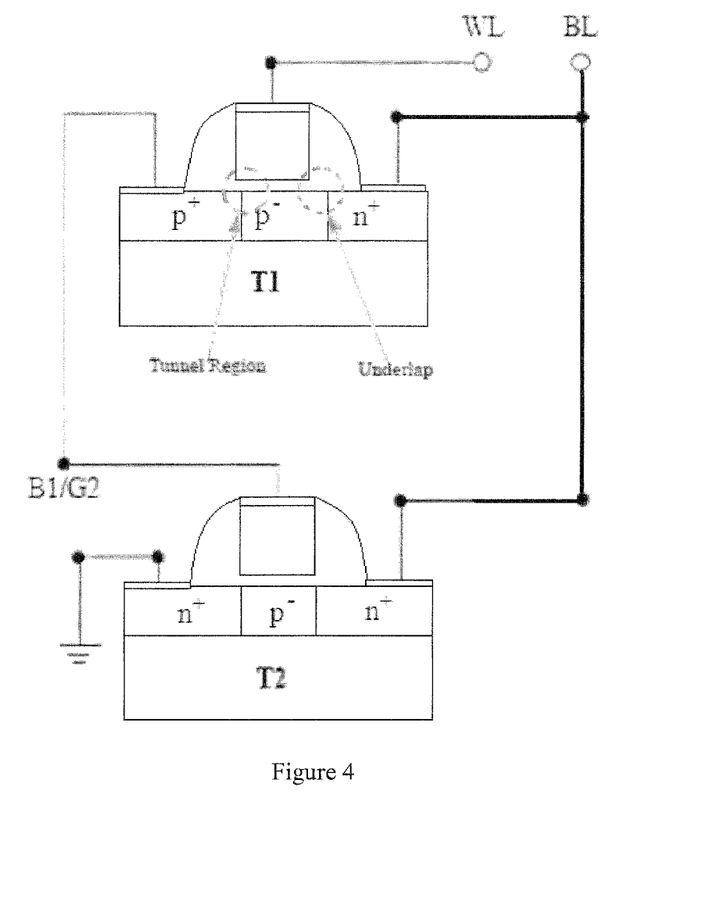
FIG. 4 shows a representation of a memory cell with a single bit line according to an embodiment of the present invention.

FIG. 4 shows a schematic representation of another embodiment of a memory cell structure. Referring to FIG. 4, a modified floating-body/gate cell (FBGC) is shown that can be fabricated on SOI for a DRAM array with one bit line. Here, the first 'transistor' T1 is provided as a gated diode, where the transistor source is made the same conductive type as the body of T1 (e.g., p-type for an n-channel transistor structure). Thus, the 'source' of T1 can be connected to the gate of the second transistor T2. A distinguishing feature of this simplified cell is the p+ region of T1. In accordance with implementations of the present invention, T1 can be a p+-intrinsic-n+ (PIN) gated diode where the intrinsic portion is a region that is not intentionally doped. The p+ "source" enables an easy, direct connection of the T1 body to the gate of the T2 MOSFET as indicated in FIG. 4. Again, similarly to the embodiment shown in FIG. 1, T1 can be designed with underlap at its 'drain' and overlap at its 'source.'

For the configuration shown in FIG. 4, a word line WL can be applied to the gate of T1, a single bit line BL can be applied to the 'drain' of T1 and the drain of T2, and the source of T2 can be tied to ground.

A biasing scheme and memory cell operation will now be described with reference to FIG. 4. According to an embodiment, by inverting the channel of T1 and applying a positive bias at the drain of T1 through BL, the tunneling current between the inversion layer and the "p+ source" can be utilized to charge the B1/G2 node. To discharge B1/G2, a forward-biased body (B1/G2)-to-BL PN junction is realized by applying a positive bias to the gate of T1 through WL and a negative bias to BL. A read operation can be performed by raising the B1/G2 voltage without disturbing the memory state and sensing the current, or voltage, of T2.

Figure 5A:
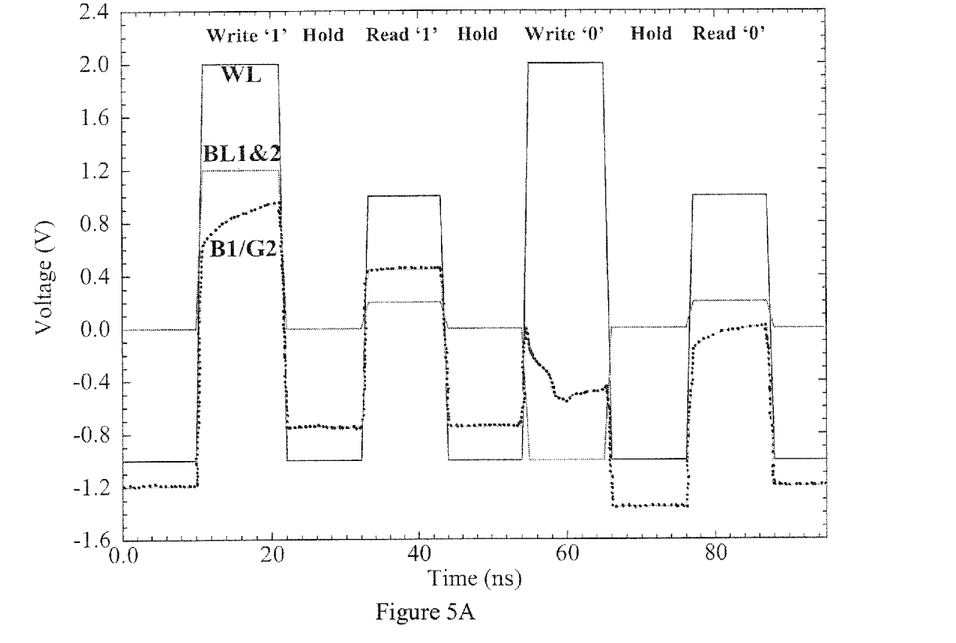
FIGS. 5A and 5B show plots of a transient sequential memory operation of a memory cell of the embodiment shown in FIG. 4, predicted by a 2-D mixed-mode numerical simulation using SenTaurus using parameters of an FD/SOI-based structure with Lg=28 nm, tox=2 nm, tSi=14 nm, tbox=50 nm, gate-source overlap=5 nm, gate-drain underlap=30 nm, undoped thin bodies, and midgap work function (TiN) gates.
Figure 5B:
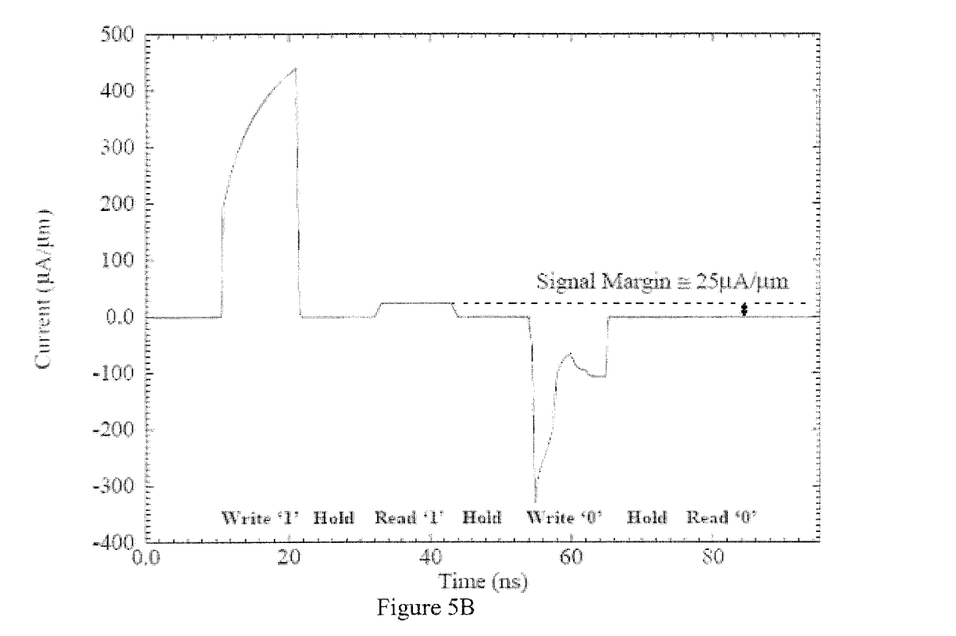

FIG. 5A shows the SenTaurus-predicted operation sequence waveforms for one implementation of this biasing scheme with BL1 and BL2 tied together (i.e., single bit line). Referring to FIG. 5B, it can seen that the signal margin between the '1' state and the '0' state is about 25 $\mu A/\mu m$. Hence, the memory cell of the modified FBGC according to embodiments of the present invention can work using one WL and one BL, which is similar to the conventional 1T/1C DRAM.

Figure 6:
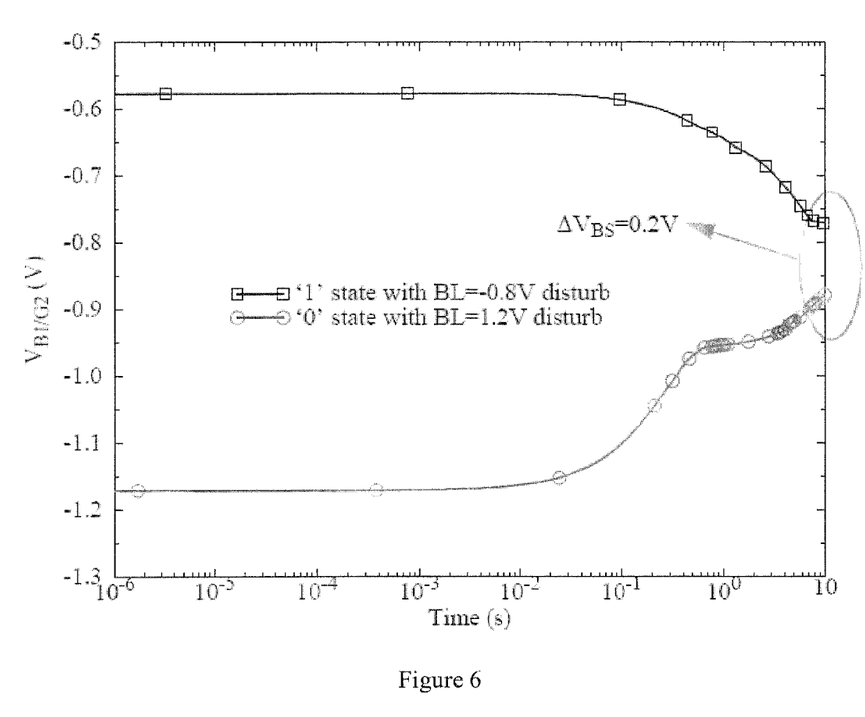
FIG. 6 shows a plot of data retention characteristics of the device of FIG. 1, predicted by a 2-D mixed-mode numerical simulation using SenTaurus using parameters of an FD/SOI-based structure with Lg=28 nm, tox=2 nm, tSi=14 nm, tbox=50 nm, gate-source overlap=5 nm, gate-drain underlap=30 nm, undoped thin bodies, and midgap work function (TiN) gates.

Based on the functionality verification transient simulations, the retention time with disturbs are predicted by SenTaurus. The simulations are performed with the designed T1 gate-drain underlap. Advantageously, the gate-drain underlap can effectively reduce the unwanted GIDL current in '0' state holding under BL disturb. By designing with the example 30 nm gate-drain underlap at the drain side of T1, ultra long (~10 s) retention time with enough sense margin ($\Delta VBs=0.2V$) is achieved, as shown in FIG. 6. For these simulations, the operation voltages for write and read are the same as in FIG. 2A. It should be noted that the simulations were conducted with the 30 nm gate-drain underlap, but embodiments of the present invention are not limited thereto.

Another embodiment of the subject technology provides a two-transistor floating-body cell for DRAM applications utilizing a body-tied-to-source (BTS) structure. Embodiments of the present invention can be applicable to any SOI (silicon-on-insulator) technology. In addition, certain embodiments of the present invention are applicable to bulk silicon technology. The two transistors of the two-transistor floating-body cell can be fabricated via planar processing, or via 3-D integration with one transistor "stacked" on top of the other. Although preferred embodiments of the present invention utilize n-type transistor structures (such as nMOSFET), embodiments of the present invention can also utilize p-type transistor structures but may require a larger cell area.

Embodiments of the can yield ultra-short (i.e., fast) write times, as well as good memory performance (i.e., large signal margin and low operating power) and very long charge-data retention times under worst-case conditions. Further, low-voltage operation is enabled, thereby providing good cell reliability.

Figure 7:
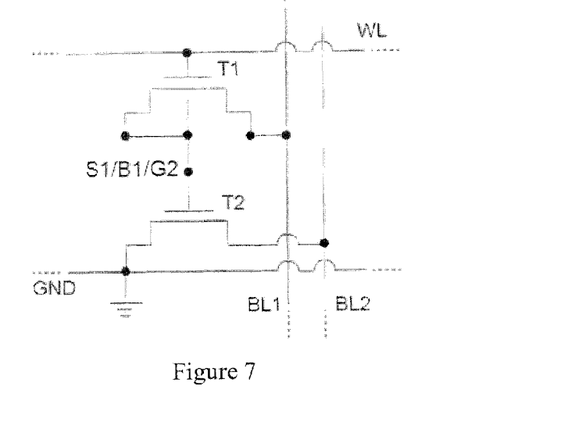
FIG. 7 shows a circuit diagram of a memory cell with two bit lines according to another embodiment of the present invention.
Figure 8A:
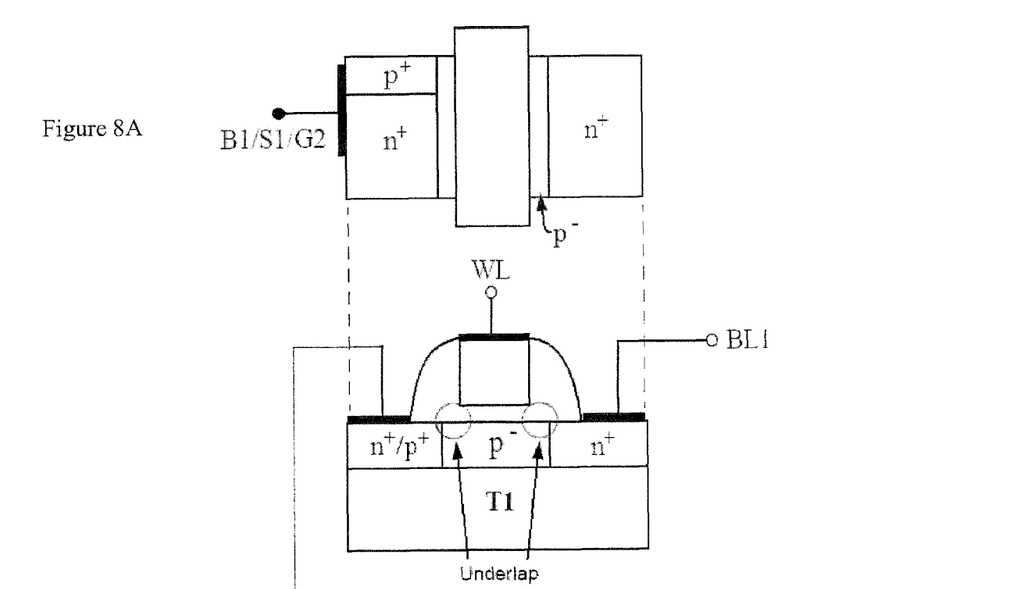
FIG. 8A shows a plan view of a portion of the memory cell in accordance with one embodiment.
Figure 8B:
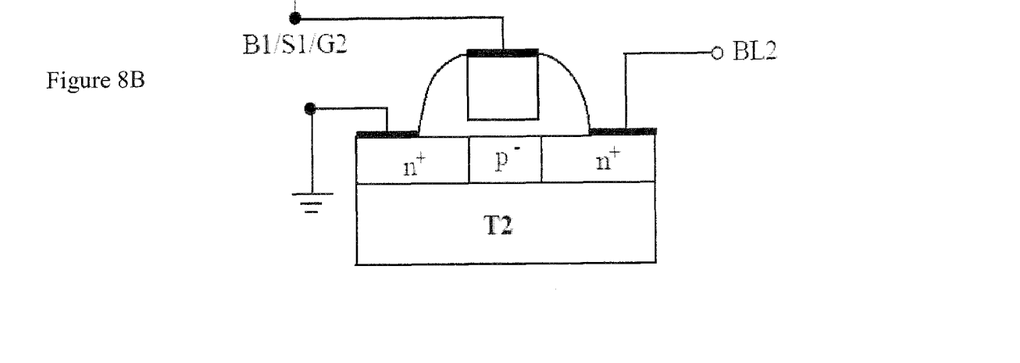
FIG. 8B shows a schematic representation of the memory cell in accordance with an embodiment of the present invention.

FIG. 7 shows a circuit representation and FIGS. 8A and 8B show a schematic representation of an embodiment of a memory cell structure. Referring to FIGS. 7, 8A, and 8B, a floating-body/gate cell utilizing a body-tied-to-source (BTS) structure (BTS-FBGC) is shown that can be fabricated on SOI for a DRAM array with two bit lines. Here, the first transistor T1 is configured as a BTS MOSFET, where its body B1 and source S1 are tied together. The B1/S2 of T1 is connected to the gate G2 of the second transistor T2.

For the configuration shown in FIGS. 7 and 8B, a word line WL can be applied to the gate of T1, a first bit line BL can be applied to the drain of T1, a second bit line can be applied to the drain of T2, and the source of T2 can be tied to ground.

As shown in FIG. 8A, in one embodiment, the body B1 of T1 can be connected to the gate G2 of T2 by using an extended p-type region in a portion of the source region of T1. That is, similarly to the modified FBGC of FIG. 1, a p+ "source" region of T1 can be connected to the gate G2 of the second transistor T2. The p+ "source" enables an easy, direct connection of the T1 body to the gate of the T2 MOSFET as indicated in FIG. 8A.

According to an embodiment of the present invention, T1 can be designed with underlap at its source and drain, such as shown in FIGS. 8A and 8B. Advantageously, alignment of the gate is not as restrictive compared to the alignment required for a conventional transistor structure. In certain embodiments, the offset created by the underlap at the source and drain can provide improved performance of the cell. The gate-source/drain underlap can be used to suppress GIDL for hold '0'.

A biasing scheme and memory cell operation will now be described with reference to FIGS. 8B and 9A. According to an embodiment, the BTS-FBGC design enables T1 to charge and discharge G2, for write '1' and write '0', via channel current. For hold '1', the G2 charge is transferred, via fast diffusion, to B1 for storage on the gate capacitance of T1, biased in accumulation. The BTS structure of T1 enables the movement of charge from G2 to B1. Therefore, it is not necessary to leave charge on G2 for hold (emulating the conventional 1T/1C DRAM cell with the capacitor replaced by the gate of T2), which would not be viable for small charges. This transfer of the stored charge to B1 for hold '1' also avoids a false read operation without having to add a read access transistor to the cell. In particular, the body/source of T1 drives the gate of T2 for reading data without significantly affecting the stored charge in T1.

Figure 9A:
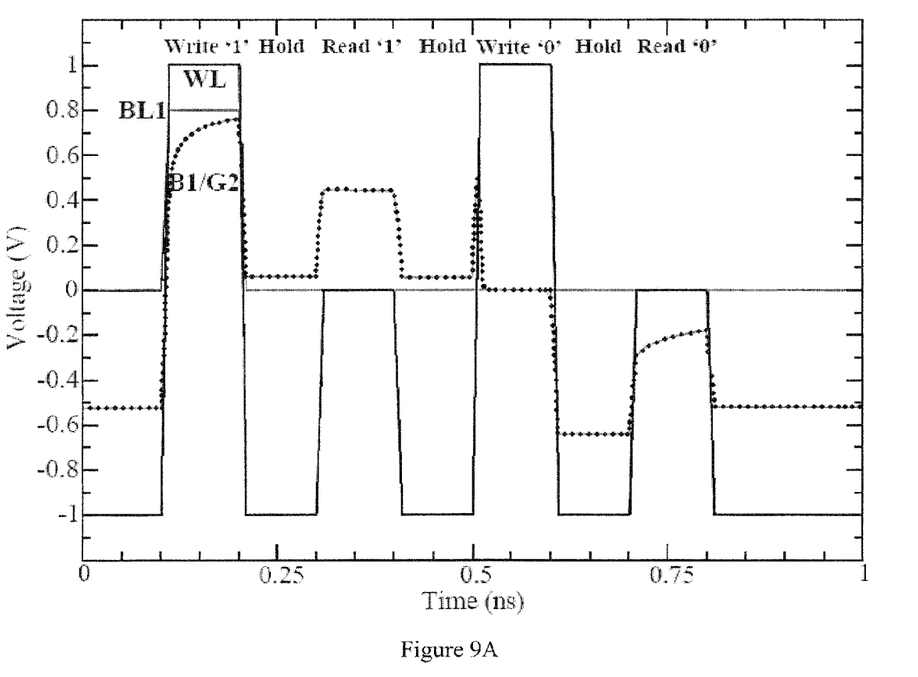
FIGS. 9A and 9B show plots of a transient sequential memory operation of a memory cell of the embodiment shown in FIG. 8B, predicted by a physics-based compact model UFPDB (ver. 2.5) in Spice3 using parameters of a 90 nm PD/SOI nMOSFET based structure with Lg=90 nm, tox=2 nm, tSi=120 nm, n+ poly gates, Vt=0.4V, BL2 bias=0.2V.
Figure 9B:
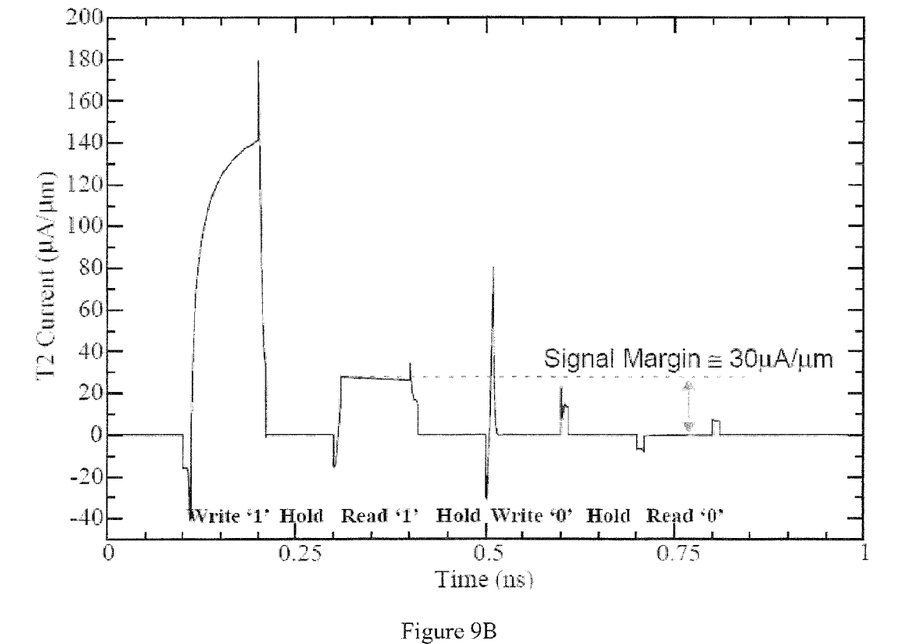

As shown in FIGS. 9A and 9B, a predicted operation sequence illustrates the effects of the described biasing scheme. The BTS-FBGC design enables T1 to charge and discharge G2, for write '1' and write '0', via channel current, which can yield ultra-fast write times (~10 ps) at low WL and BL1 voltages. After writing a '1', the stored charge is moved to B1 for holding '1' by dropping the WL voltage negative, which removes the T1 channel and creates an accumulation condition for storing the charge.

In the plots, a constant voltage of 0.2V is applied to the second bit line BL2. The fixed voltage to BL2 causes the BL2 current during write '1'; this current would be effectively eliminated via BL2 pulsing in actual memory operation, thereby yielding very low overall dynamic power. Referring to FIG. 9B, it can seen that the signal margin between the '1' state and the '0' state is about 30 µA/µm. Further, the inclusion of the underlap of the gate to the source and drain of T1 can provide long retention times. These long retention times can be further lengthened by using the enabled low operational voltages.

Although the simulations for the BTS-FBGC are demonstrated using PD/SOI (partially depleted) MOSFETs, FD/SOI may be used as well, including FinFETs.

Advantageously, the BTS-FBGC enables use of a MOSFET in lieu of the capacitor in conventional DRAM. Further, memory operation can be accomplished using small stored charge because the charge in the body B1 of T1 is used to drive T2 for reading data without being significantly expended.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

We claim:

1. A dynamic memory comprising:
   a first transistor structure having a first gate, a first drain connected to a first bit line, a first source, and a first body, wherein the first source is tied to the first body; and
   a second transistor structure having a second gate coupled to the first body that is tied to the first source, a second source connected to a ground, and a second drain connected to a second bit line.

2. The dynamic memory according to claim 1, wherein the first gate is connected to a word line such that the first transistor structure charges and discharges the second gate by using channel current of the first transistor structure.

3. A dynamic memory cell, comprising:
   a first gate electrode on a gate insulating layer on a p-type region of a substrate, the first gate electrode being connected to a word line;
   a first n+ drain region at one side of the p-type region in the substrate, the first n+ drain region being connected to a first bit line;
   a first n+ source region in the substrate at an opposite side of the p-type region from the first n+ drain region;
   a p+ region extending from the p-type region at the opposite side of the p-type region adjacent the first n+ source region, the p+ region providing a contact region for electrical connection to the p-type region;
   a second gate electrode on a second gate insulating layer, wherein the n+ source region and the p+ region are tied together and connected to the second gate electrode;
   a second n+ drain region at a side of the gate electrode, the second n+ drain region being connected to a second bit line; and
   a second n+ source region at another side of the gate electrode, the second n+ source region being connected to a ground.

4. The dynamic memory cell according to claim 3, wherein the first gate electrode is disposed having an underlap with at least one of the first n+ drain region and the first n+ source region.

* * * * *